United States Patent [19]
Choi et al.

[11] Patent Number: 5,317,534
[45] Date of Patent: May 31, 1994

[54] A MASK READ ONLY MEMORY DEVICE

[75] Inventors: Jeong-Hyeok Choi; Chul-Ho Shin, both of Seoul, Rep. of Korea

[73] Assignee: SamSung Electronics Co., Ltd., Suwon, Rep. of Korea

[21] Appl. No.: 981,488

[22] Filed: Nov. 25, 1992

Related U.S. Application Data

[62] Division of Ser. No. 792,590, Nov. 15, 1991, Pat. No. 5,200,355.

[30] Foreign Application Priority Data

Dec. 10, 1990 [KR] Rep. of Korea ............... 90-20260
Dec. 10, 1990 [KR] Rep. of Korea ............... 90-20261

[51] Int. Cl.$^5$ ............................................. G11C 11/40
[52] U.S. Cl. ................................. 365/182; 365/178; 365/189.01; 365/51
[58] Field of Search ............. 365/112, 189.01, 189.02, 365/186, 178, 51

[56] References Cited

U.S. PATENT DOCUMENTS 4,709,351 11/1987 Kaogaya ............... 365/189.01

Primary Examiner—Terrell W. Fears
Attorney, Agent, or Firm—Robert E. Bushnell

[57] ABSTRACT

A method for manufacturing highly integrated NAND and NOR logic mask read only memory (MROM) devices is disclosed. Over the top surface of a semiconductor substrate, where a first polysilicon layer is formed, a pattern of a gate electrode is formed along a word line in the order of odd numbers or even numbers. Next, an insulation layer having a thickness of a submicron range is formed over the top surface of the substrate. And then a photoresist is covered and an etch back process is performed. Thereafter, the exposed insulation layer caused by the etch back process and the polysilicon layer are selectively etched to form a word line spacing corresponding to a thickness of the insulation layer. Thus, spacing between adjacent word lines can be minimized and a process margin can be sufficiently ensured.

23 Claims, 18 Drawing Sheets

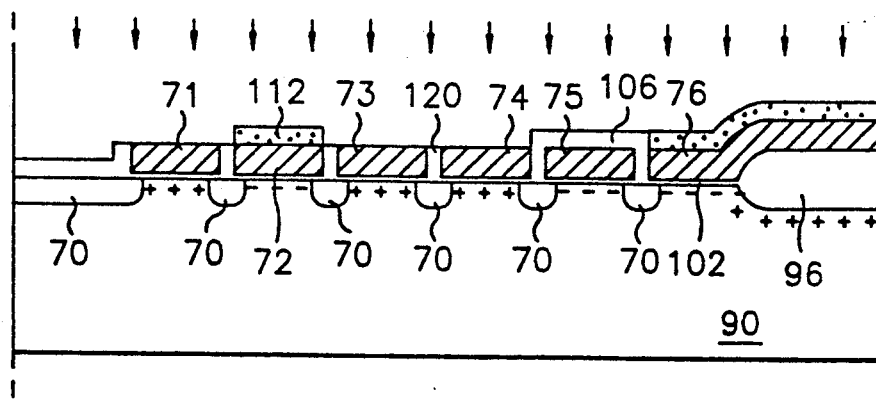
FIG. 10L
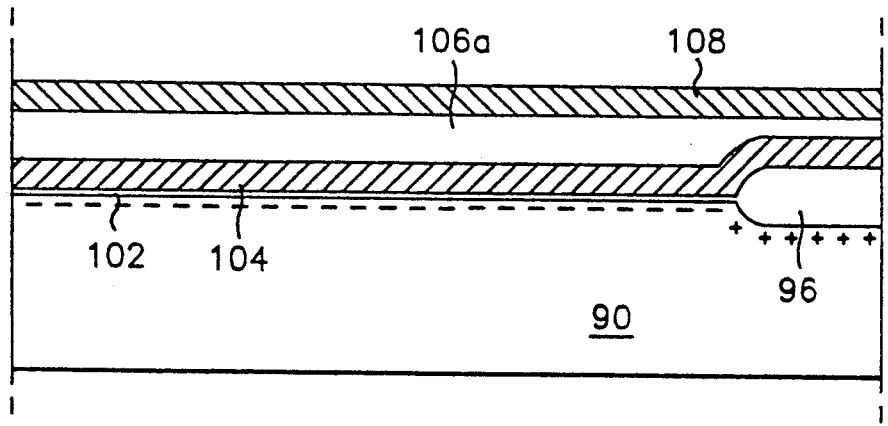
FIG. 10C'
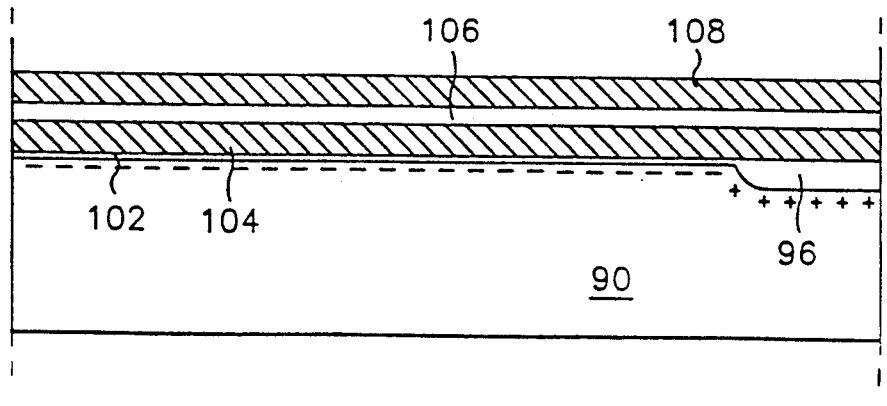
FIG. 10C"

A MASK READ ONLY MEMORY DEVICE

This is a divisional application Ser. No. 07/792,590, filed Nov. 15, 1991 now U.S. Pat. No. 5,200,355.

BACKGROUND OF THE INVENTION

The present invention relates to a semiconductor memory device, and more particularly to a method for manufacturing highly integrated NAND and NOR logic mask read only memory (MROM) devices.

Generally, a mask read only memory (hereinafter referred to as a mask ROM) is used for storing a control logic such as a microprogram in an information processing system or the contents of a game in a game chip, or it is used in an office automation equipment and an electronic musical instrument, etc.

Recently, as the more increased storage capacity and the high resolution of a character font and high tone quality in the office automation equipment, electric musical instrument or television game, etc., is carried out, a demand for a cheap and large capacity large-scale integration mask ROM has increased. In order to meet such a demand, a NAND logic mask ROM for increasing integrated degree is disclosed in U.S. Pat. No. 4,142,176. The NAND logic mask ROM has a structure that a plurality of depletion mode transistors and a plurality of enhancement mode transistors are serially connected through a diffusion layer. The NAND logic mask ROM requires only one contact per string. In the NAND logic mask ROM, the string is defined as a group of cells serially connected between each column line and a ground voltage terminal. The NAND logic mask ROM disclosed in the above patent is described with reference to FIGS. 1 to 3.

FIG. 1 shows a partial equivalent circuit diagram of the NAND logic mask ROM and serially connected eight memory cells constitute one string. A first transistor 1 connected to a bit line B/L is a string select transistor and its gate is used as a string select line. Second to ninth transistors 2 to 9 connected between the first transistor 1 and a ground voltage terminal are operated as memory cells. A memory cell array of the NAND logic mask ROM is constructed so that a plurality of memory strings are in parallel connected to the bit line and a memory cell positioned on the same row shares word lines 12 to 19. When performing the reading operation by selecting, for example, the fourth transistor 4, a reading voltage of approximately 1 to 2 volts is applied to a selected bit line, and a power voltage Vcc is applied to the word lines 12, 13, 15, 16, 17, 18 and 19 of the memory cell except for a selected string line 11 and the fourth transistor 4. Meanwhile, the word line 14 of the fourth transistor 4 is grounded. In this case, an unselected bit line, the string select line and an unselected word line are a grounded state. As a result, if the fourth transistor 4 is an enhancement mode, the fourth transistor 4 is turned off by a ground voltage applied to its gate. Thus, since the reading voltage applied to the bit line is cut off, a logic "0" is read out. Moreover, if the fourth transistor 4 is a depletion mode, the fourth transistor 4 is turned on by the ground voltage applied to its gate. Thus, since the reading voltage applied to the bit line is transferred to the fourth transistor 4, a logic "1" is read out. That is, a logic "1" or "0" is read out by applying the ground voltage to the gate of a cell using a depletion transistor of a normally ON type and an enhancement transistor of a normally OFF type.

FIG. 2 is a layout schematic view of a conventional NAND logic mask ROM of FIG. 1. It should be noted that the same parts as those shown in FIG. are designated by like reference numerals. First there is an longitudinally elongated active line 22 which is formed within a semiconductor substrate. The word lines 11 to 19 and a ground line 20 are laterally elongated from the upper portion of the active line 22 and longitudinally disposed in parallel. A metal line 24 is overlapped with the active line 22 from the upper portion of the word lines 11 to 19, and a contact region 26 is for contacting the active line 22 and the metal line 24.

FIG. 3 is cross-sectional view of FIG. 2 taken along the line a—a'. Over the surface of a semiconductor substrate 30 of a first conductivity type, where a field oxide layer 32 is formed, a plurality of gates 11 to 16 interposing a gate oxide layer 34 are formed. A metal layer 24 contacting with a predetermined active region 22 is separated with the plurality of gates 11 to 16 by an insulation interlayer 36. In this case, a plurality of transistors including the gates 11 to 16 are serially connected by the active region 22 formed between the gates 11 to 16. Moreover, each transistor is a programmed state to an enhancement mode or a depletion mode and the gates 11 to 16 are used as word lines.

In case of a conventional NAND logic mask ROM, after forming a polycrystalline silicon (polysilicon) layer, a word line of a memory cell is simultaneously formed by performing a photolithography process. Consequently, spacing between word lines is limited by a limitation of the photolithography process. That is, when forming a pattern by the photolithography process, since the pattern spacing of a photoresist is limited by a resolution limitation of a mask pattern, it is difficult to render the separation spacing between the word lines below the limitation value of the photolithography process. Furthermore, after completing a pattern of the word line, the ion implantation process of impurities is carried out in order to program each memory cell to a wanted mode. To this, during the photolithography process for exposing only a predetermined gate to which impurities are implanted, an accurate alignment of a mask is required. If the alignment of the mask is not accurate, since the impurities are implanted into the neighboring memory cell, the operation of the reliable mask ROM can't be obtained.

Next, a layout schematic view of a conventional NOR logic mask ROM is shown in FIG. 4. A word line 42 parallel to a second direction of a longitudinal direction is extended to a first direction of a transverse direction. An active region 44 is extended to the second direction, and a bit line 46 is overlapped with the active region 44 and formed on the upper portion thereof. A contact region 48 is contacted by the active region 44 and the bit line 46. However, since one contact region is formed with respect to two bits, it has a problem that the entire area is increased.

FIG. 5 is a layout schematic view of another conventional NOR logic mask ROM. The NOR logic mask ROM called a flat cell is available from Sharp Co., and described in "Symposium on VLSI Circuit", 1988, PP. 85 and 86. A word line 50 formed with a polysilicon layer is extended to a first direction of a transverse direction and disposed in parallel to a second direction of a longitudinal direction. A bit line 52 formed with an n+ diffusion layer is disposed in parallel to the first direction and extended to the second direction. When one word line passes neighboring two bit lines, a channel region is formed and the channel region operated as a unit cell 54. Meanwhile, since the bit line is formed with the n+ diffusion layer, only one contact region is formed with respect to a few tens of cells considering the resistance of the bit line instead of one contact region per cell. In the above figure, one contact region is formed with respect to 32 bits. Moreover, since a bit line used as a source or drain of one cell is used as a drain or source of a neighboring cell, the source and drain regions of each cell are reduced to a half in comparison with a conventional mask ROM.

FIG. 6 shows an equivalent circuit diagram of the NOR logic mask ROM shown in FIG. 5. A channel is formed between neighboring two bit lines, and gates in a same row share a word line. When performing reading operation by selecting, for example, a transistor 54, a power source voltage Vcc of approximately 5 volts and a voltage of approximately 2 volts is applied to a bit line B/L1 and a word line W/L2, respectively and a bit line B/L2 is grounded. Moreover, unselected bit lines B/L3, . . . maintain a floating state and unselected word lines W/L1, W/L3, . . . are grounded. As a result, if the threshold voltage of the selected cell is under 2 volts, the selected cell is turned on and the current comes to flow, thereby reading out a logic "1" state.

FIG. 7A is a cross-sectional view of FIG. 5 taken along the line b—b' of a word line direction, and FIG. 7B is a cross-sectional view of FIG. 5 taken along the line c—c' of a bit line direction.

In FIG. 7A, an active region 52 of a second conductivity type formed on a predetermined region of a semiconductor substrate 56 having a first conductivity type is used as a bit line. On the top surface of the substrate 56, a gate oxide layer 60, a word line 50 formed with a polysilicon layer and an insulation layer 62 are successively formed, and a metal layer 58 is formed over the upper portion of the active region 52.

In FIG. 7B, a gate oxide layer 60 is formed on the top surface of the semiconductor substrate 56 of the first conductivity type. Moreover, the word line 50 is formed over a predetermined region of the substrate 56 and the insulation layer 62 is formed over the whole surface of the substrate 56. However, in this case, when performing a pattern, the separation spacing between the word lines is limited by the limitation of the ordinary photolithography process. Meanwhile, as an obstacle factor for reducing the separation spacing between the adjacent word lines to a submicron range, a process margin during ion implantation process for programming the cell should be taken into account. That is, if the separation spacing is the submicron range, since a neighboring cell in addition to a programmed cell is exposed caused by a misalignment or overdevelopment, etc., unwanted data may be stored. Thus, in order to ensure the reliability of products, the word line spacing determining a cell spacing couldn't be reduced to a certain degree.

As described above, in a conventional NAND and NOR logic mask ROMs, since the minimum spacing between the word lines is limited by the limitation of the photolithography process, it has a disadvantage that the achievement of the highly integrated memory device is difficult. Meanwhile, even if the spacing between the word lines becomes a submicron range, during the program of a memory cell, it is difficult to ensure the process margin. Moreover, a very high precision in a process is required for programming only a wanted cell.

SUMMARY OF THE INVENTION

It is therefore an object of the present invention to provide a method for manufacturing a mask ROM having minimum spacing between adjacent word lines.

It is another object of the present invention to provide a method for manufacturing a mask ROM which can sufficiently ensuring a process margin during an ion implantation process for a program of a cell.

It is a further object of the present invention to provide a method for manufacturing a mask ROM which can minimize spacing between adjacent word lines and simultaneously sufficiently ensuring a process margin during an ion implantation process for a program of a cell.

In accordance with one aspect of the present invention, over the top surface of a semiconductor substrate, where a first polysilicon layer is formed, a pattern of a gate electrode is formed along a word line in the order of odd numbers or even numbers. Next, an insulation layer having a thickness of a submicron range is formed over the surface of the substrate. And then a photoresist is covered and an etch back process is performed. Thereafter, the exposed insulation layer by the etch back process and the polysilicon layer are selectively etched to form a word line spacing corresponding to a thickness of the insulation layer.

In accordance with another aspect of the present invention, different insulation layers are formed on the top surface of neighboring word lines and each insulation layer is selectively etched by a different etching process.

BRIEF DESCRIPTION OF THE DRAWINGS

These and other features of the invention will be understood from the following description of illustrative embodiments, with reference to the drawings, in which:

FIGS. 10A to 10L and FIGS. 10C' and 10C" are views illustrating manufacturing process of a NAND logic mask ROM of FIG. 8;

DETAILED DESCRIPTION OF THE PREFERRED EMBODIMENT

Figure 8:
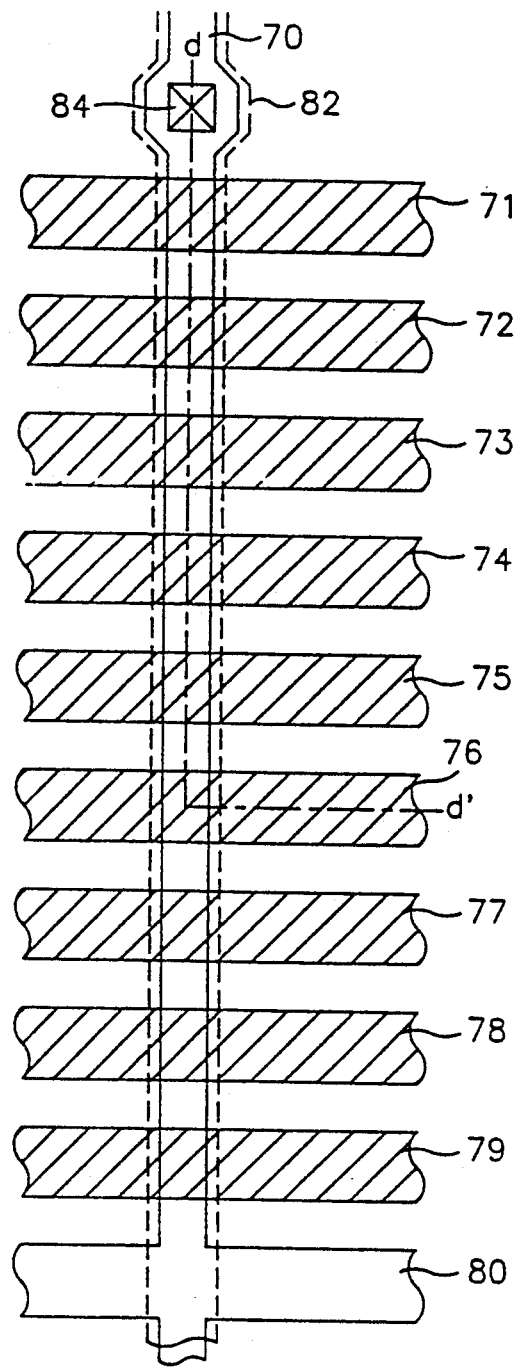
FIG. 8 is a layout schematic view of a NAND logic mask ROM according to the present invention.

Referring to FIG. 8, there is a longitudinally elongated active line 70 which is formed within a semiconductor substrate. Word lines 71 to 79 and a ground line 80 are laterally elongated from the upper portion of the active line 70 and longitudinally disposed in parallel. A metal line 82 is overlapped with the active line 70 from the upper portion of the word lines 71 to 79, and a contact region 84 is for contacting the active line 70 and the metal line 82. The spacing between the adjacent word lines is formed to a submicron range lower than the limitation of a photolithography process.

Figure 9:
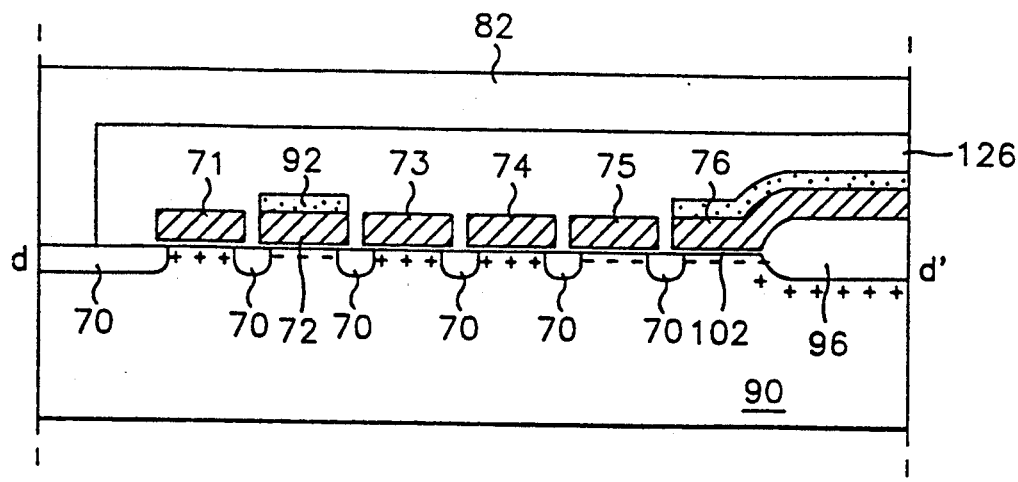
FIG. 9 is a cross-sectional view of FIG. 8 taken along the line d—d'.

FIG. 9 is a cross-sectional view of the NAND logic mask ROM shown in FIG. 8 taken along the line d—d'. In the following description, it should be noted that the same parts as those shown in FIG. 8 are designated by like reference numerals. Over the surface of a semiconductor substrate 90 of a first conductivity type, where a field oxide layer 96 is formed, a plurality of gates 71 to 76 interposing a gate oxide layer 102 are formed. A metal layer 82 contacting with a predetermined active region 70 is separated with the plurality of gates 71 to 76 by an insulation interlayer 126. In this case, a plurality of transistors including the gates 71 to 76 are serially connected by the active region 70 formed between the gates 71 to 76. Moreover, each transistor is a programmed state to an enhancement mode or a depletion mode and the gates 71 to 76 are used as word lines.

FIGS. 10A to 10L are views illustrating manufacturing process of a NAND logic mask ROM of FIG. 8.

Figure 10A:
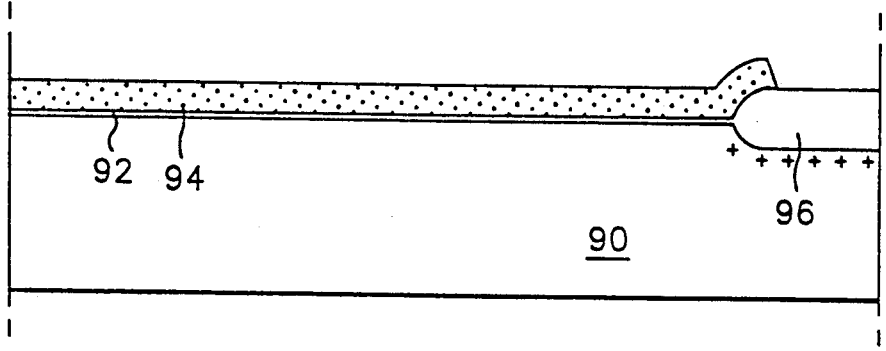

In FIG. 10A, a start material is a (100) oriented, p-type silicon wafer. After removing an oxide layer (not shown) formed through a dry oxidation by a wet etching, on the surface of the semiconductor substrate 90, a pad oxide layer 92 having a thickness of approximately 300Å is grown in an oxygen ($O_2$) atmosphere at a temperature of 950° C. Next, a nitride layer 94 is deposited to a thickness of approximately 1500Å, and the nitride layer 94 corresponding to an isolation region is removed for isolating a plurality of strings of a memory cell array. Thereafter, boron ions are implanted into the surface of the substrate 90 at an energy level of 300 KeV to a dose of 6.0 E13 ions/cm$^2$ to form a channel stop region. Following this, a field oxide layer 96 is formed to a thickness of approximately 5000Å by a wet oxidation at a temperature of 1000° C. during two hours.

Figure 10B:
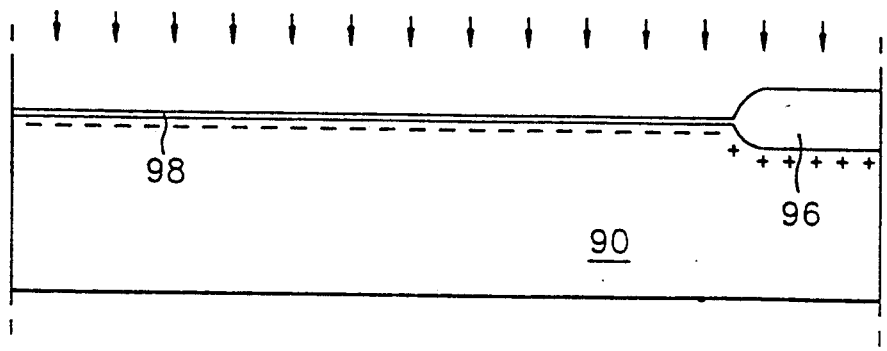

In FIG. 10B, the pad oxide layer 92 and the nitride layer 94 are removed by the wet etching and a sacrificial oxidation process is performed for improving the characteristic of a gate oxide layer to be formed. That is, a sacrificial oxide layer 98 having a thickness of approximately 300Å is formed at a temperature of 950° C. by a dry oxidation process. And then, after defining a memory cell region by a photolithography process, arsenic or phosphorous ions are implanted at an energy level of 100 KeV to a dose of 6.0E12 ions/cm$^2$. At this time, the memory cell region becomes a depletion mode by the implanted impurities of n-type.

Figure 10C:
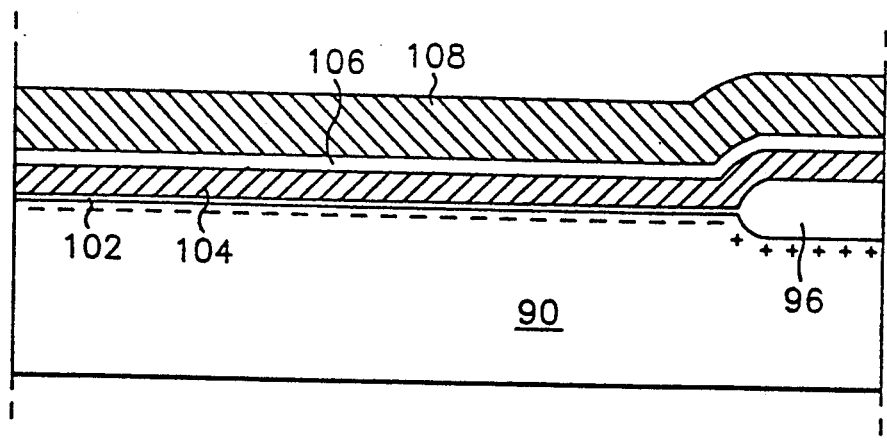

As shown in FIG. 10C, after removing the sacrificial oxide layer 98 by the wet etching, a gate oxide layer 102 having a thickness of approximately 250Å is formed by the dry oxidation process at a temperature of 950° C. Next, over the surface of the substrate 90, a first polysilicon layer 104 is formed to a thickness of approximately 2000Å. And then, in order to reduce a resistance of the first polysilicon layer 104, POCL$_3$ is doped, to thus have the sheet resistance of the first polysilicon layer 104 under 20Ω/□. A first oxide layer 106 having a thickness of 1000–2000Å is formed on the entire surface of the first polysilicon layer 104. In this case, the first oxide layer 106 may be formed with a thermal silicon oxide layer, a silicon oxide layer formed by chemical vapor deposition, a Spin On Glass oxide layer, a low temperature oxide layer, a nitride layer, a polysilicon layer or a mixed layer with these materials. Meanwhile, the first oxide layer 106 is used as a mask for used in a program ion implantation. Next, a second polysilicon layer 108 having a thickness of approximately 5000Å is formed on the entire surface of the first oxide layer 106 and POCL$_3$ is doped in order to reduce the resistance of the second polysilicon layer 108. Thus, the sheet resistance of the second polysilicon layer 108 also becomes 20Ω/□ and less. It should be noted that at this point, the surface height of the second polysilicon layer 108 formed on the memory cell region is higher than that of the first polysilicon layer 104 formed on the surface of the field oxide layer 96.

Figure 10D:
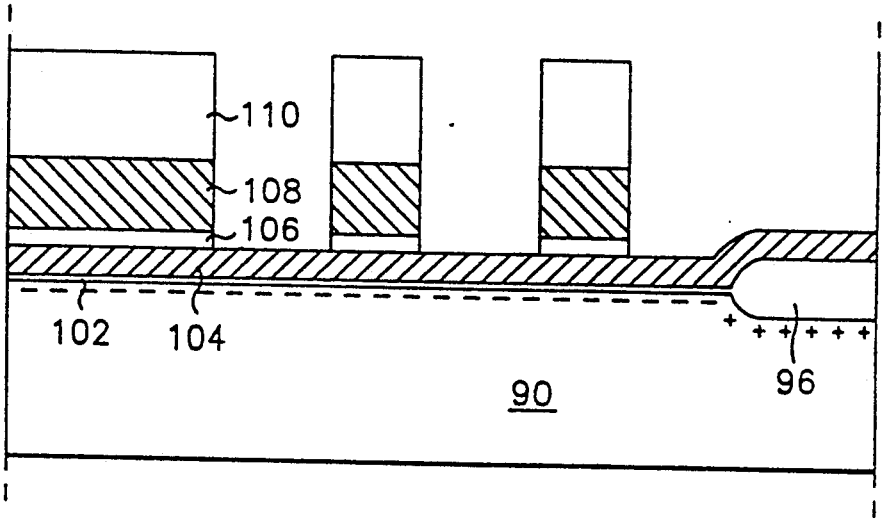

Referring to FIG. 10D a first photoresist 110 is formed over the surface of the substrate 90 and a pattern is formed by a photolithography process. Thus, the exposed second polysilicon layer 108 and the first oxide layer 106 are removed until the first polysilicon layer is exposed. The pattern formation of the second polysilicon layer 108 is formed along the word line in the order of add numbers. And then the first photoresist 110 is removed.

Figure 10E:
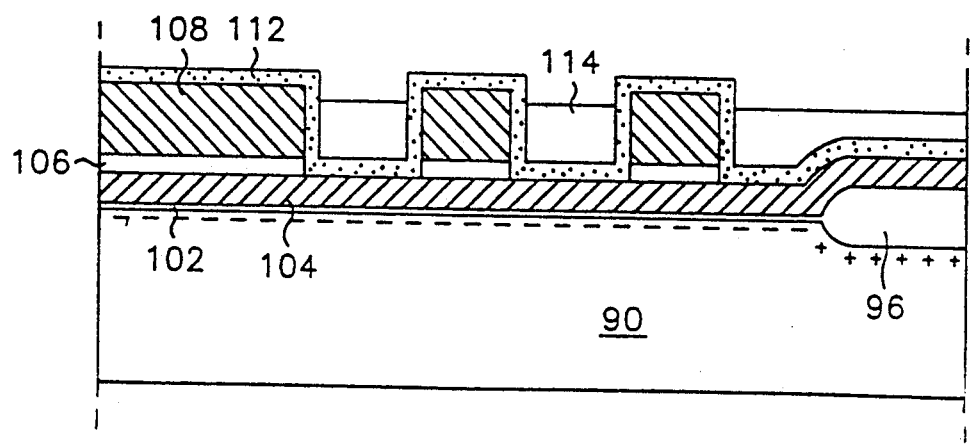

Following this, over the whole surface of the substrate 90, a nitride layer 112 having a thickness of 1000–2000Å is deposited and a second photoresist 114 is formed. Next, the second photoresist 114 is etched through an etch back process, thereby sufficiently exposing the nitride layer 112 positioned on the patterned the second polysilicon layer 108 as shown in FIG. 10E. At this time, a dry etchant having a good selectivity of the nitride layer and the photoresist in used. Moreover, instead of the nitride layer 112, a thermal silicon oxide layer, an oxide layer formed by chemical vapor deposition, a Spin On Glass oxide layer, a low temperature oxide layer, a polysilicon layer or a mixed layer with these materials may be formed. However, the insulation layer formed on the top surface of the second polysilicon layer 108 and the insulation layer formed on the top surface of the first polysilicon layer 104 must have a different etch rate, or a different layer etched by the different etchant. Meanwhile, the second photoresist 114 may be replaced with the Spin On Glass oxide layer having a good fluidity.

Figure 10F:
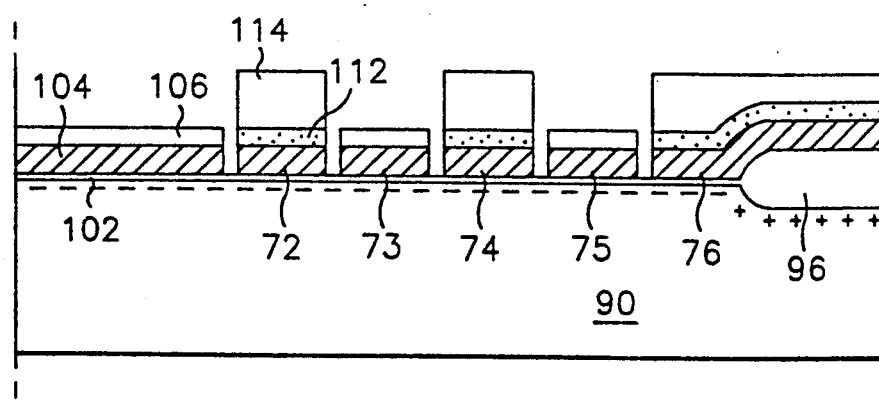

In FIG. 10F, after removing the exposed nitride layer 112, gates of a memory cell 72 to 76, i.e., word lines are completed by etching the exposed first polysilicon layer 104 through a dry etching process. Thereafter, the second polysilicon layer 108 serving as a mask is completely removed through an overetching. During the second polysilicon layer 108 is etched, a plurality of gates 72 to 76 and the substrate 90 are protected by the nitride layer 112, the first oxide layer 106 and the gate oxide layer 102.

Figure 10G:
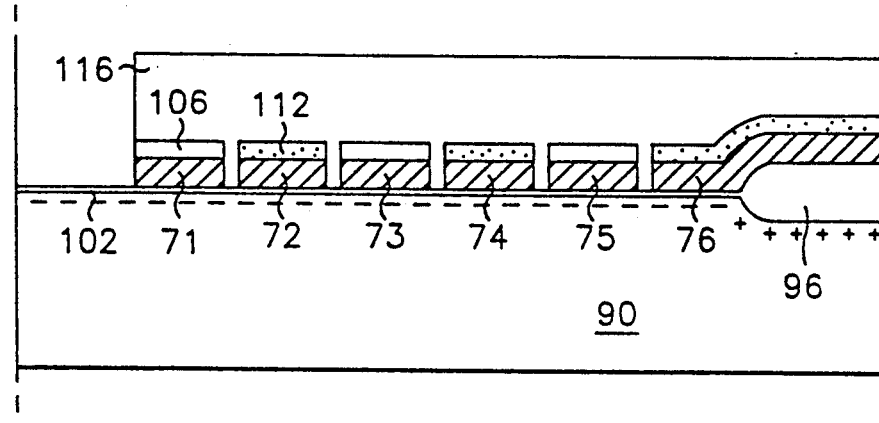

Now, as shown in FIG. 10G, after removing the second photoresist 114, a third photoresist 116 is formed over the partial surface of the substrate 90 except for a predetermined region of the substrate 90. And then, a string select line 71 neighboring the plurality of word lines 72 to 76 is formed by removing the first oxide layer 106 and the first polysilicon layer 104 uncovered with the third photoresist 116, to thus complete a memory cell array.

Figure 10H:
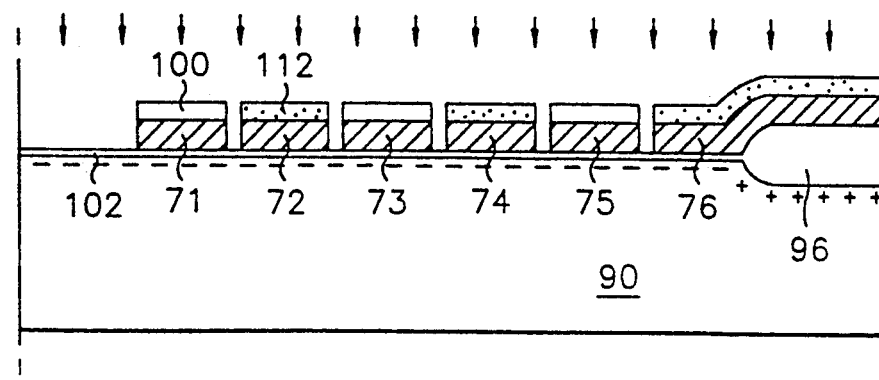

In FIG. 10H, the third photoresist 116 is removed and arsenic or phosphorous ions are implanted at an energy level of 40 KeV to a dose of 6.0E15 ions/cm² to form an active region 70 of source and drain regions. In this case, the channel region under the plurality of gates 71 to 76 is protected by the gates 71 to 76 formed with the polysilicon and the first oxide layer 106 or the nitride layer 112. Meanwhile, in case of simultaneously forming the active region of an n-type and p-type, through the different photolithography process, impurities of the n-type or p-type are implanted, respectively.

Figure 10I:
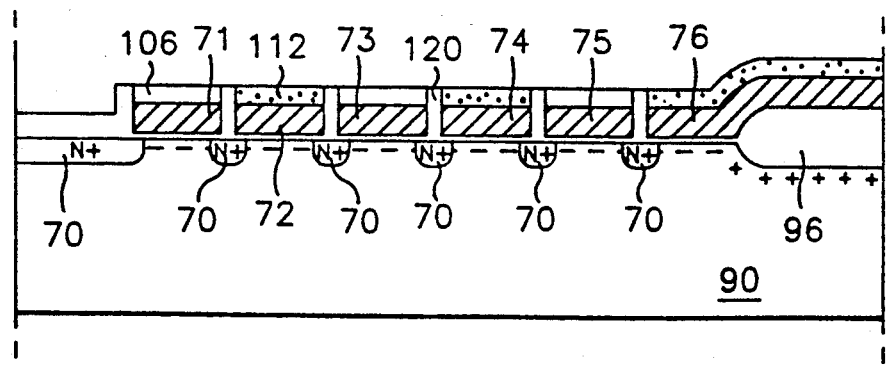

Referring to FIG. 10I, after ion implanting the impurities of the n-type or p-type, the impurities implantation area is activated by performing an oxidation process at a low temperature under 900° C. during a short time. Thus, an active region is simultaneously formed along with a second oxide layer 120 on a sidewall of the gates 71 to 76. At this time, on the top surface of the gates 71 to 76, the growth of the oxide layer is suppressed by the first oxide layer 106 and the nitride layer 112.

Figure 10J:
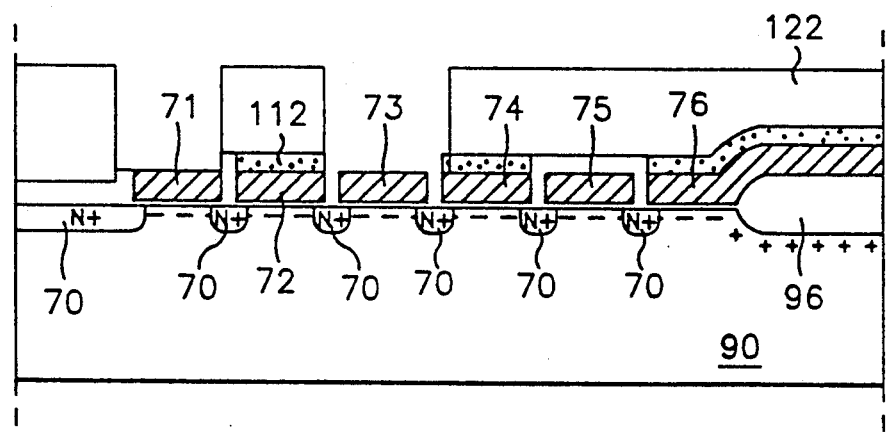

In FIG. 10J, for a programming of the memory cell a cell to be formed to an enhancement mode among the word lines protected by the first oxide layer 106 is defined with a fourth photoresist 122. Thus, the exposed first oxide layer 106 is removed. At this time, the cell of the neighboring word line may be exposed by an error of the photolithography process. However, since the nitride layer 112 is formed on the top surface of the neighboring word line, there is no influence caused by the selective etching process of the first oxide layer 106. Therefore, when defining the word line protected by the first oxide layer 106, a wanted region can be sufficiently exposed.

Figure 10K:
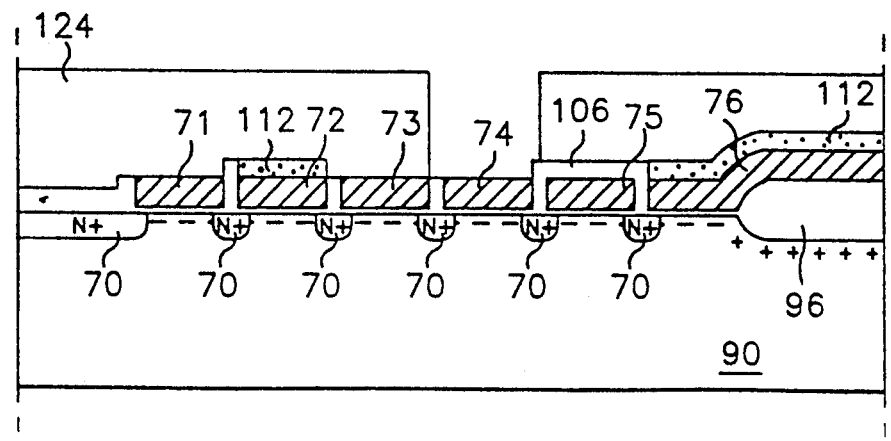

In FIG. 10K, after removing the fourth photoresist 122, a cell to be formed to the enhancement mode among the word lines protected by the nitride layer 112 is defined with a fifth photoresist 124. Thus, the exposed nitride layer 112 is removed. It is readily appreciated that at this point, the neighboring word line is protected by the first oxide layer 106 formed thereon.

Through the process of FIG. 10J or FIG. 10, the step of a program mask is completed.

Following this, after removing the fifth photoresist 124, boron ions are implanted over the whole surface of the substrate 90 at an energy level of 65 KeV to a dose of 0.8E13 ions/cm² – 1.3E13 ions/cm² as shown in FIG. 10L. Thus a p-type channel is formed by doping boron under the portions of the word lines unprotected by the first oxide layer 106 or the nitride layer 112. As a result, wanted program data is formed to each memory cell. Thereafter, a low temperature oxide layer and a BPSG (Boro-Phospho Silicate Glass) layer are deposited over the surface of the substrate 90 and a insulation interlayer 126 is formed by reflowing the BPSG layer and the low temperature oxide layer in a nitrogen (N₂) atmosphere at a temperature of 800°–925° C. And then, the insulation interlayer 126 on the surface of a predetermined active region 70 is etched to form opening. Next, a metal is deposited by sputtering and patterned to form a metal layer 82.

In the preferred embodiment of the present embodiment, the process of FIG. 10J is followed by that of FIG. 10K. However, prior to the process of FIG. 10J, the process of FIG. 10K can be performed. Moreover, when patterning and etching the second polysilicon layer along the word lines, it is necessary to protect the first polysilicon layer positioned under the second polysilicon layer from the damage caused by the etching process. To satisfy this, the thick second polysilicon layer is formed. Therefore, the surface height of the second polysilicon layer is higher than that of the first polysilicon layer formed on the field oxide layer. However, in another preferred embodiment, when forming an insulation layer 106a after depositing the first polysilicon layer 104, a planarization process can be performed by reflowing a BPSG (Boro-Phospho Silicate Glass), PSG (Phospho Silicate Glass) or SOG (Spin On Glass), etc., having good fluidity, as shown in FIG. 10′. Moreover, a planarization process of the field oxide layer 96 may be performed. In order to planarize the field oxide layer 96, trench and recessed oxide processes or an etch back process may be carried out. In case of depositing first and second polysilicon layers 106 and 108 through the planarization process of the field oxide layer 96, a cross-sectional view is shown in FIG. 10C″.

Furthermore, in the preferred embodiment of the present invention, the first and second polysilicon layer have a nearly same sheet resistance. This is for preventing the loss of the gate oxide layer exposed after etching the first polysilicon layer in case that the first polysilicon layer is etched faster than the second polysilicon layer in the process of FIG. 10F. However, the first and second polysilicon layers may be have a different sheet resistance. For example, by increasing the doping concentration of the second polysilicon layer instead of the first polysilicon layer, the faster etchant in an etch rate of the polysilicon layer having a high doping concentration can be used. In the same way, by increasing the doping concentration of the first polysilicon layer instead of the second polysilicon layer, the faster etchant in an etch rate of the polysilicon layer having a low doping concentration can be used.

As described above, in a method for manufacturing a NAND logic mask ROM, after firstly forming the word line pattern in the order of odd numbers, by forming an insulation layer on the surface of the pattern, the thickness of the insulation layer is adjusted and therefore the spacing between the word lines can be easily adjusted to minute spacing under the limitation of a photolithography process. Furthermore, since a predetermined gate is exposed through the different photolithography process after forming the different insulation layer over the top surface of the neighboring word line, even if an error is generated on a mask alignment, the neighboring word line is protected by the different insulation layer.

Figure 1:
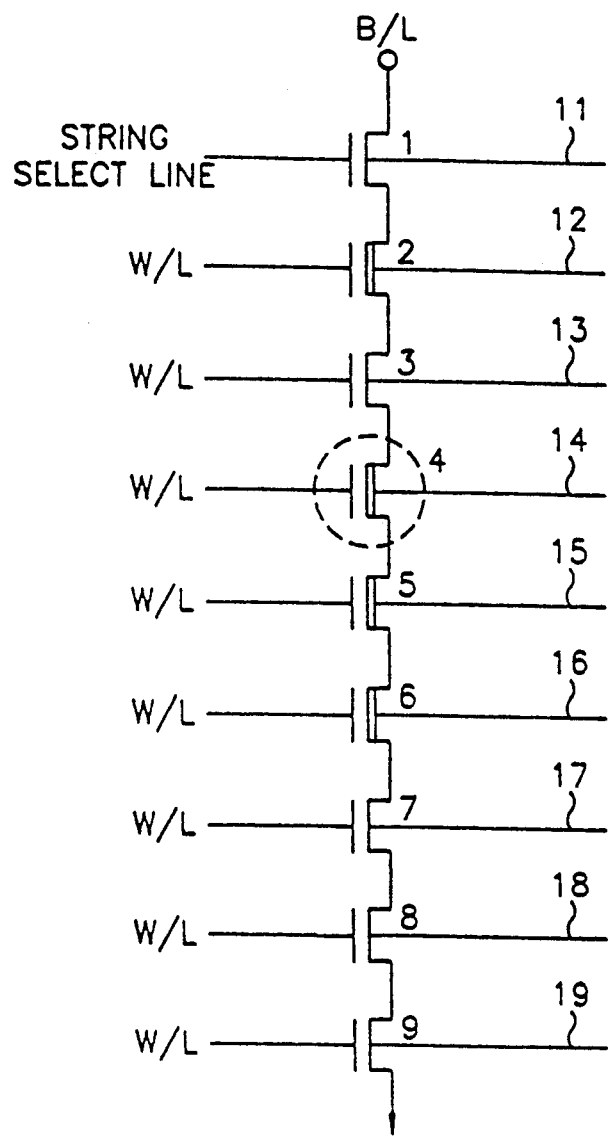
FIG. 1 is a partial equivalent circuit diagram of a conventional NAND logic mask ROM.
Figure 2:
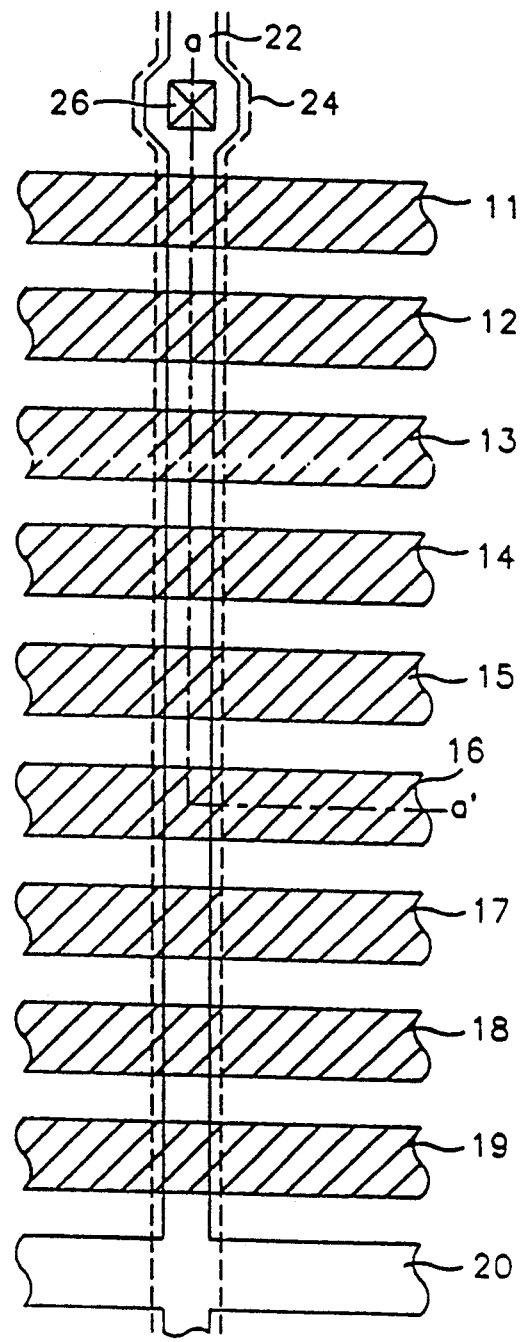
FIG. 2 is a layout schematic view of FIG. 1.
Figure 3:
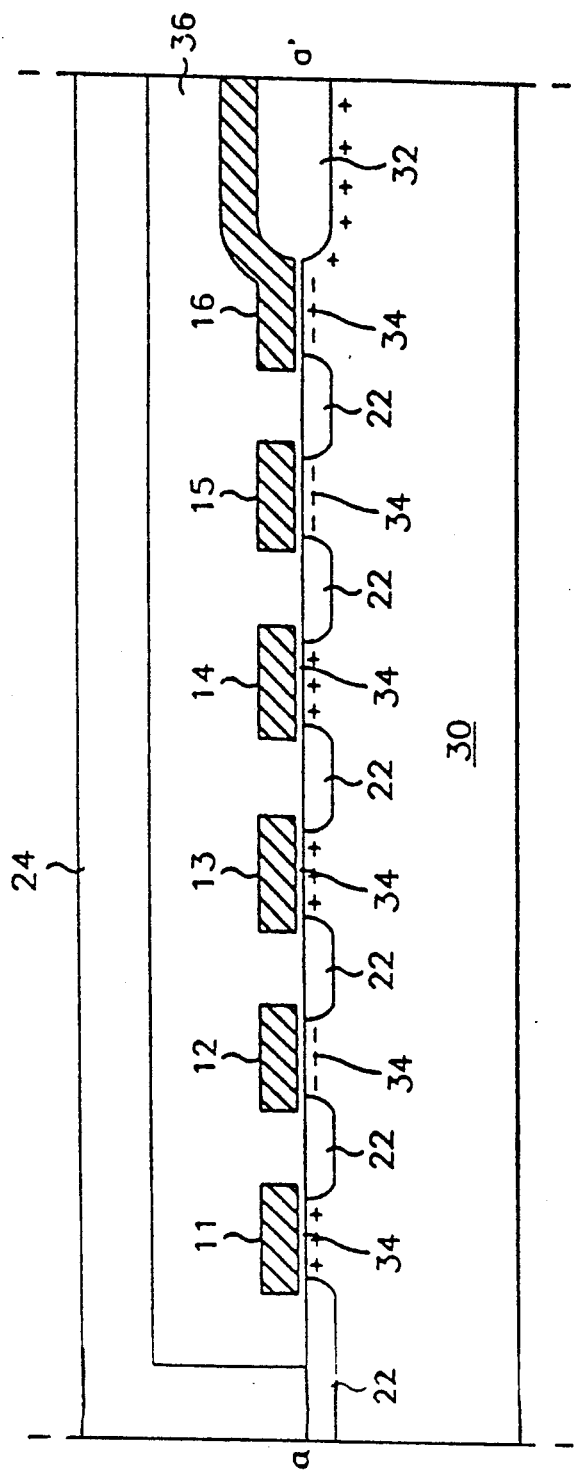
FIG. 3 is a cross-sectional view of FIG. 2 taken along the line a—a'.
Figure 4:
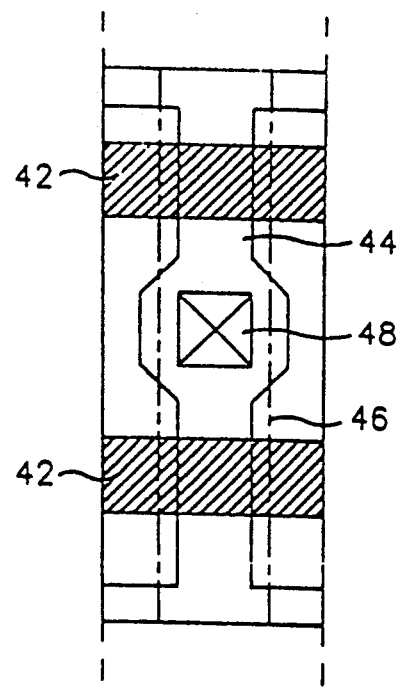
FIG. 4 is a layout schematic view of a conventional NOR logic mask ROM.
Figure 5:
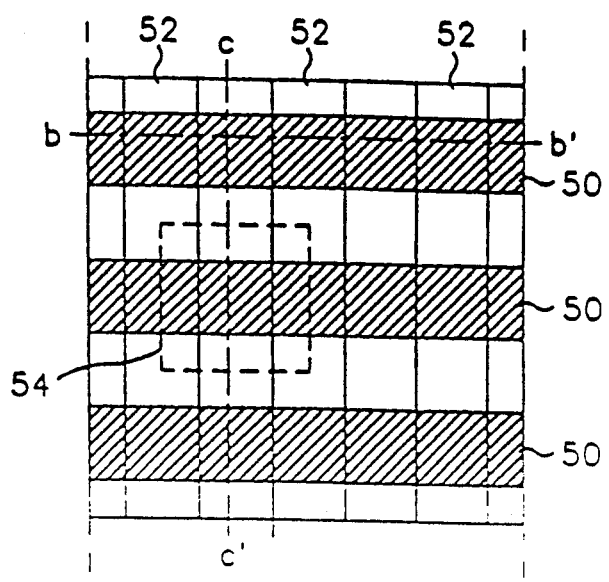
FIG. 5 is a layout schematic view of another conventional NOR logic mask ROM.
Figure 6:
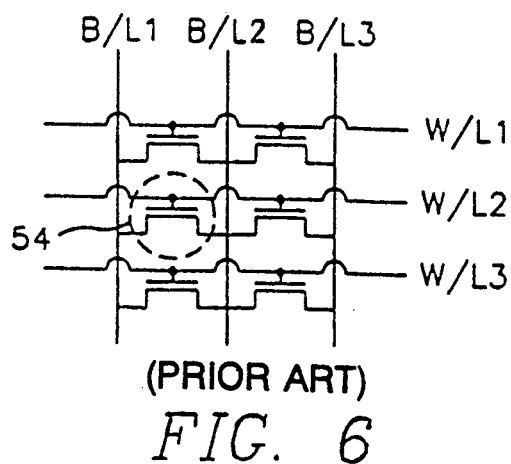
FIG. 6 is an equivalent circuit diagram of FIG. 5.
Figure 7A:
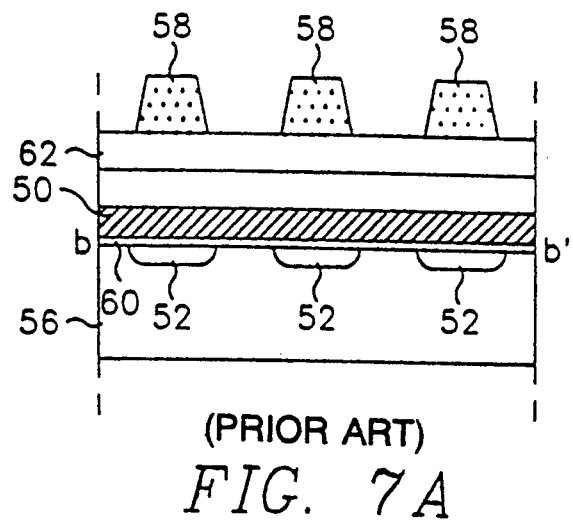
FIGS. 7A and 7B are cross-sectional views of FIG. 5.
Figure 7B:
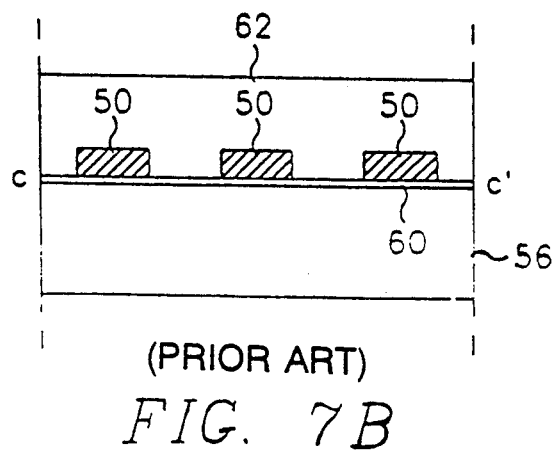
Figure 11:
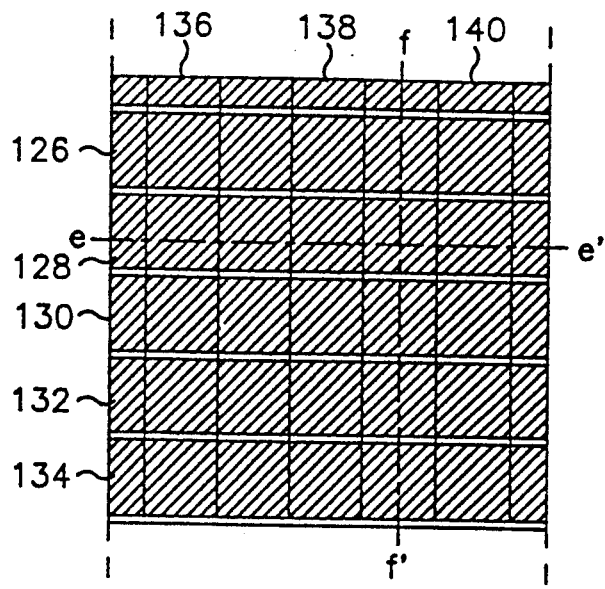
FIG. 11 is a layout schematic view of a NOR logic mask ROM according to the present invention.

Next, a NOR logic mask ROM is described. FIG. 11 shows a layout schematic view of a NOR logic mask ROM. Word lines 126, 128, 130, 132 and 134 parallel to a second direction of a longitudinal direction are extended to a first direction of a transverse direction, and bit lines 136, 138 and 140 parallel to the first direction is extended to the second direction. It is readily appreciated that the spacing between word lines is narrowly formed in comparison with FIGS. 4 and 5.

Figure 12A:
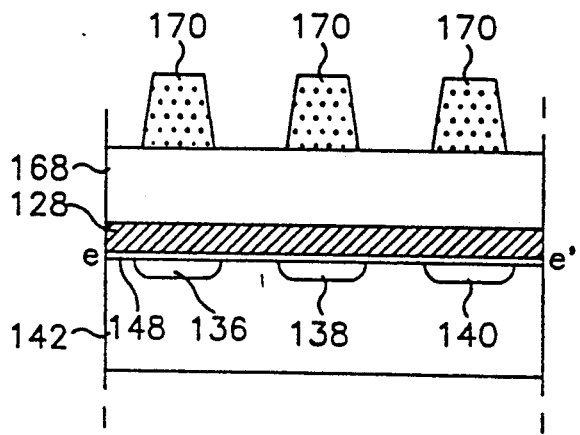
FIGS. 12A and 12B are cross-sectional views of FIG. 11.
Figure 12B:
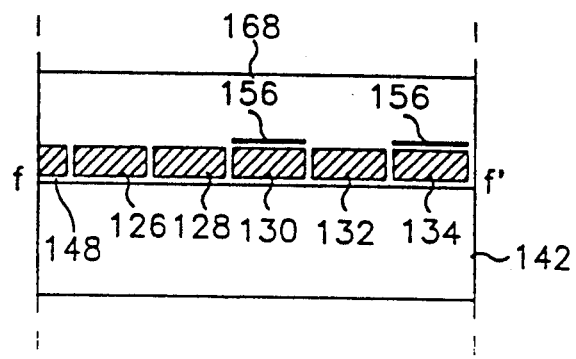

FIG. 12A is a cross-section view of FIG. 11 taken along the line e—e' of a word line direction, and FIG. 12B is a cross-sectional view of FIG. 11 taken along the line f—f' of a bit line direction.

In FIG. 12A, diffusion regions 136, 138 and 140 are formed on a predetermined region of a semiconductor substrate 142 having a first conductivity type, On the top surface of the substrate 142, a gate oxide layer 148, a word line 128 formed with a polysilicon layer and an insulation interlayer 168 are successively formed and a metal layer 170 is formed over the upper portion of the diffusion regions 136, 138 and 140.

In FIG. 12B, a gate oxide layer 148 is formed on the top surface of a semiconductor substrate 142 having a first conductivity type, and a plurality of word lines 126, 128, 130, 132 and 134 are disposed on the surface of the gate oxide layer 148 with uniform spacing. An insulation interlayer 168 is formed over the entire surface of the substrate 142 and the diffusion regions 136, 138 and 140 of a second conductivity type are used as a bit line.

FIG. 13A to FIG. 13H are views illustrating manufacturing process of a NOR logic mask ROM of FIG. 11.

Figure 13A:
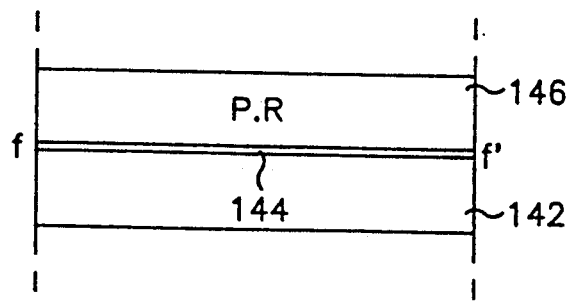
FIGS. 13A to 13H are views illustrating manufacturing process of a NOR logic mask ROM of one preferred embodiment according to the present invention.

In FIG. 13A, a start material is a (100) oriented, p-type silicon wafer having a resistivity of 18Ω-cm. Now a pad oxide layer 144 having a thickness of approximately 300Å is formed on the top surface a semiconductor substrate 142 through an oxidation process in an oxygen (O$_2$) atmosphere at a temperature of 950° C. Following this, over a predetermined region of the substrate 142, a pattern of a first photoresist 146 is formed by a photolithography process for forming source and drain regions to be used as a bit line. And then, arsenic ions are implanted at an energy level of 75 KeV to a dose of 6.0E15 ion/cm$^2$. Thereafter, through an oxidation process, a thick oxide layer may be formed over the surface of the n+ ion implantation region of a buried type n+ region.

Figure 13B:
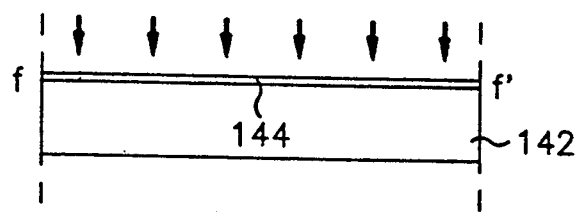

In FIG. 13B, after removing the first photoresist 146, boron ions are implanted at an energy level of 30 KeV to a dose of 1.0E12 ions/cm$^2$ in order to adjust the threshold voltage. In this case, the initial state of a cell becomes an enhancement mode.

Figure 13C:
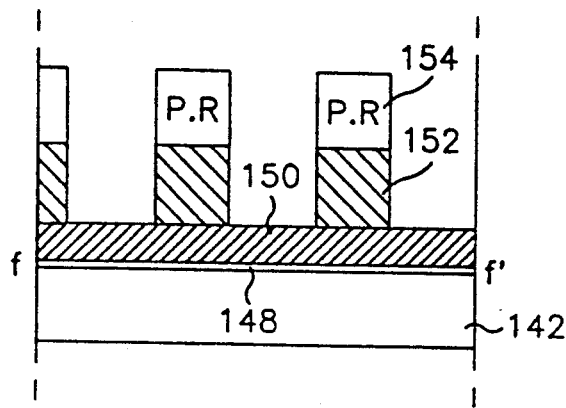

Referring to FIG. 13C, after removing the pad oxide layer 144 by a wet etching, a gate oxide layer 148 having a thickness of approximately 200Å is formed on the top surface of the substrate 142. Next, a first polysilicon layer 150 is formed on the surface of the gate oxide layer 148 to a thickness of approximately 4000Å. And then, POCL$_3$ is doped so as to have the sheet resistance of approximately 20Ω/□. Thereafter, an oxide layer 152 for used in a program ion implantation is formed to a thickness of approximately 7000Å and a second photoresist 154 is formed. Next, along the word line in the order of odd numbers or even number, the pattern of the photoresist 154 is formed. Thus, the exposed oxide layer 152 is etched until the surface of the first polysilicon 150 is exposed.

Figure 13D:
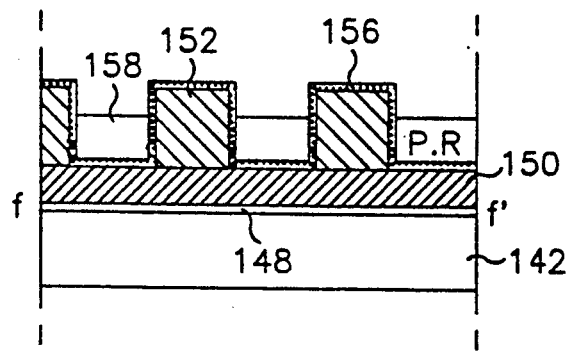

Following this, after removing the second photoresist 154, a nitride layer 156 having a thickness of 1000–3000Å is deposited by a low pressure chemical vapor deposition method. Next, a third photoresist 158 of 1µm thickness is formed and an etch back process is performed until the nitride 156 formed on the oxide layer 152 is sufficiently exposed, as shown in FIG. 13D. Thus, the third photoresist 158 remains only on the regions between the oxide layers 152.

Figure 13E:
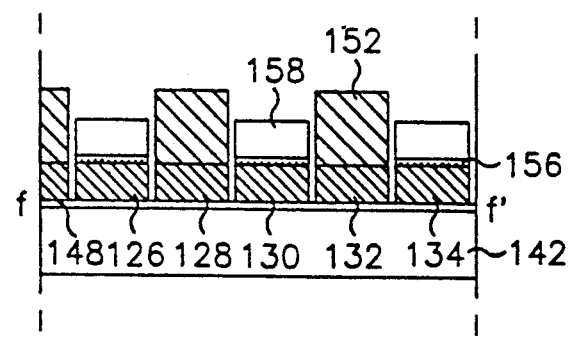

Referring to FIG. 13E, the exposed nitride layer 156 is removed through a selective etching, and the first polysilicon layer 150 formed under the removed nitride layer is removed by a dry etching. Consequently, a plurality of word line patterns 126, 128, 130, 132 and 134 are completed in a line with spacing as much as the thickness of the nitride layer 156.

Figure 13F:
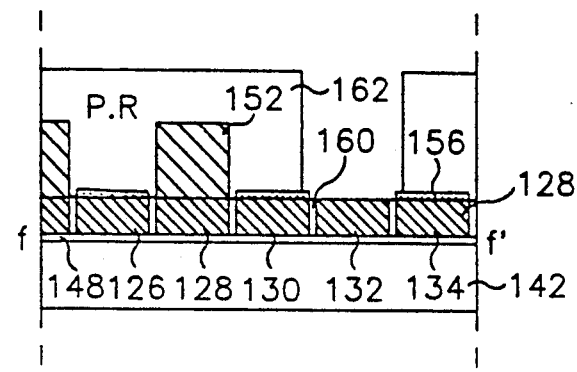

In FIG. 13F, after removing the third photoresist 158 remained on the surface of the nitride layer 156, an oxidation process is performed at a temperature of 900° C. Thus, over the entire surface of the substrate 142, an oxide layer 160 for insulating between the word lines is formed. In this case, on the top surface of the word lines, the growth of the oxide layer 160 is suppressed by the oxide layer 152 or the nitride layer 156, and the oxide layer 160 is formed only between the word lines. Meanwhile, in order to improve the insulation capacity between the word lines, after removing the third photoresist 158, before performing the oxidation process, a channel stop region may be formed by implanting boron ions over the entire surface of the substrate 142 at an energy level of 30 KeV to a dose of 1.0E13 ions/cm$^2$. Then a fourth photoresist 162 is formed over the surface of the substrate 142. Next, the cell to be programmed among the regions protected by the oxide layer 152 is exposed by a photolithography process and the exposed oxide layer is removed.

Figure 13G:
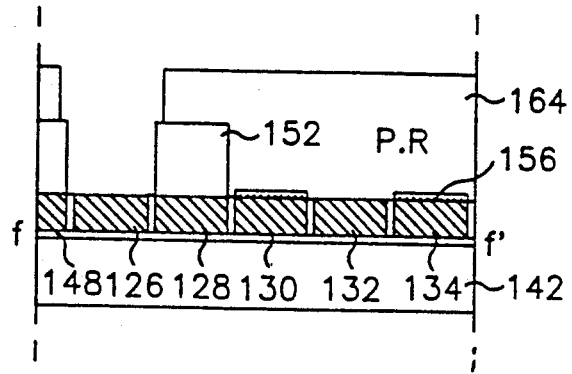

Following this, after removing the fourth photoresist 162, a fifth photoresist 164 is formed. Then the cell to be programmed among the regions protected by the nitride layer 156 is exposed by the photolithography process and the exposed nitride layer 156 is removed as shown in FIG. 13G. At this time, the processes shown in FIG. 13F and FIG. 13G can be performed in the reverse order. Moreover, even if the neighboring cell region is exposed caused by an error on the mask alignment, since the oxide layer or nitride layer is formed thereon, there is no influence by the photolithography process.

Figure 13H:
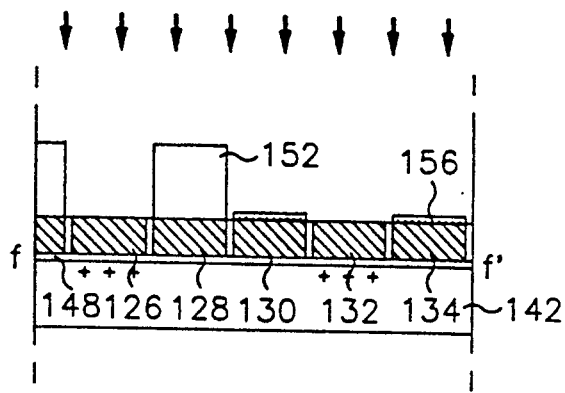

In FIG. 13H, the fifth photoresist 164 is removed. And then, boron ions are implanted at an energy of 130–200 KeV to a dose of 1.0–4.0E12 ions/cm$^2$ to program the cell including word lines unprotected by the oxide layer or the nitride layer. At this time, the energy of the impurities has a level which can pass the word lines 126 and 132 and the gate oxide layer 148 formed under the word line but can't pass the word lines 128, 130 and 134 formed by the oxide layer or the nitride layer thereon. Thus, the programmed cell having a threshold voltage above 2 volts and the unprogrammed cell having a threshold voltage of 0.6–1.0 volts are formed by ion implanting only on a wanted cell. Next, an insulation interlayer 168 is deposited over the surface of the substrate 142, and a contact region is formed by a photolithography process. Following this, a metal wiring is formed on a predetermined region, to thus complete a metal electrode 170.

Figure 14A:
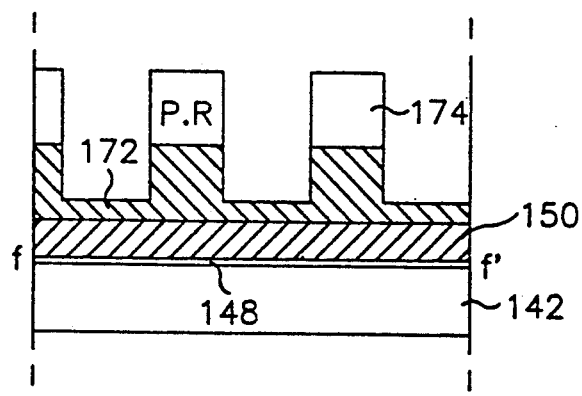
FIGS. 14A to 14C are views illustrating manufacturing process of a NOR logic mask ROM of another preferred embodiment according to the present invention.
Figure 14B:
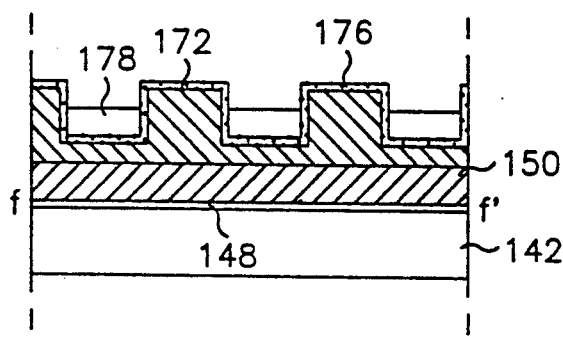
Figure 14C:
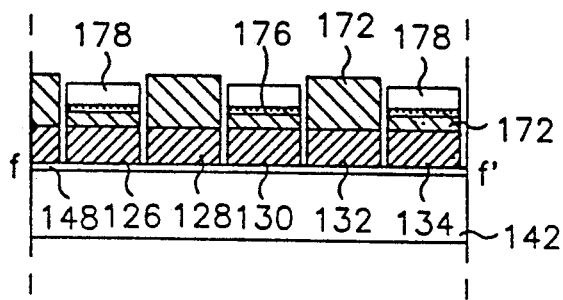

FIG. 14A to FIG. 14C are views illustrating manufacturing process of a NOR logic mask ROM and in particular, another preferred embodiment from FIG. 13C to FIG. 13E.

After the process shown in FIG. 13B, the pad oxide layer 144 is removed by a wet etching and a gate oxide layer 148 having a thickness of approximately 200Å and a first polysilicon layer 150 having a thickness of approximately 4000Å are successively formed as shown in FIG. 14A. Thereafter, POCL$_3$ is doped so that the sheet resistance of the first polysilicon layer 150 becomes approximately 20Ω/□. Next, an oxide layer 172 for used in a program ion implantation is formed to a thickness of approximately 7000Å and a photoresist 174 is covered. And then, the pattern of the photoresist 174 is formed along the word line in the order of odd numbers or even numbers, through an ordinary photolithography process. Thus, an etching process is performed until the thickness of the exposed oxide layer 172 becomes approximately 2000Å.

Next, after removing the photoresist 174, a nitride layer 176 having a thickness of 200Å-500Å is formed by a low pressure chemical vapor deposition as shown in FIG. 14B. Thereafter, a photoresist 178 is formed to a thickness of approximately 1μm, and an etch back process is performed until the nitride layer 176 formed on the surface of the unetched oxide layer 172 is sufficiently exposed.

In FIG. 14C, the exposed nitride layer 176 is removed through a selective etching process, and the oxide layer 172 and the first polysilicon layer 150 formed under the removed nitride layer 176 are removed by a dry etching. As a result, the oxide layer 172 on the top surface of the neighboring word lines has a thickness of 7000Å and 2000Å. Thus, the pattern of a plurality of word lines 126, 128, 130, 132 and 134 disposed in a line is completed with spacing as much as the thickness of the nitride layer 176. One of the neighboring word lines is protected by the oxide layer and the other is protected by a mixed layer with the oxide layer and the nitride layer. Thereafter, the processes from FIG. 13F to FIG. 13H are sequentially performed.

In the preferred embodiment shown in FIG. 13A to FIG. 13H, when forming the pattern of the oxide layer for used in a program ion implantation, by etching the oxide layer for used in the program ion implantation until the surface of the first polysilicon is exposed, different insulation layers are formed on the top surface of the neighboring word lines. Thus, by using a property that the two insulation layers have different etch rate, the word line of a cell to be programmed is exposed through the different photolithography process. However, in the preferred embodiment shown in FIG. 14A to FIG. 14C, when etching the oxide layer for used in the program ion implantation, the oxide layer is remained to a predetermined thickness. Thus, the insulation layer having same etch rate is included on the top surface of the neighboring word lines. However, by using a difference in a thickness of the insulation layer, the word line of the cell which does not want the program is protected during a program ion implantation process. Here, the thickness of the remaining oxide layer is not exceeding ⅓ of the entire thickness. Thus, through the etching process of the oxide layer for used in the program ion implantation for completing the word line and the etching process for exposing a predetermined word line among the word lines protected by a mixed layer with the oxide layer and the nitride layer, even if the oxide layer for used in the program ion implantation is etched as much as remaining thickness, a sufficient thickness of the insulation layer capable of preventing the ion implantation during the program ion implantation process is ensured.

Figure 15A:
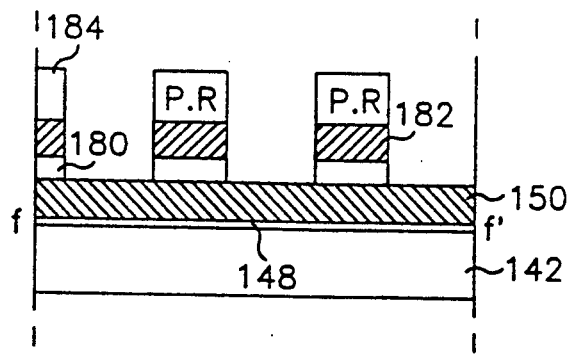
FIGS. 15A to 15C are views illustrating manufacturing process of a NOR logic mask ROM of still another preferred embodiment according to the present invention.
Figure 15B:
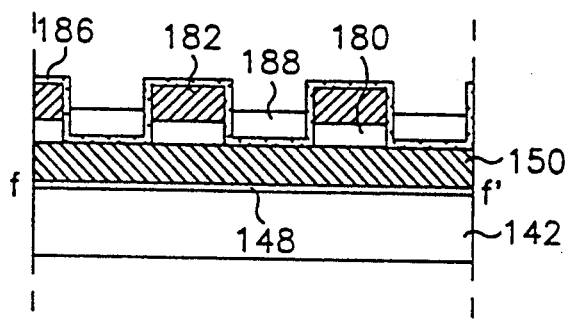
Figure 15C:
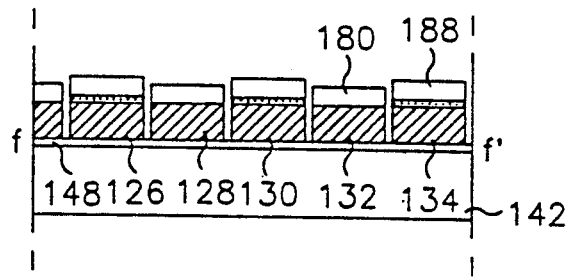

FIG. 15A to FIG. 15C are views illustrating manufacturing process of a NOR logic mask ROM and in particular, still another preferred embodiment for FIG. 13C to FIG. 13E.

Referring to FIG. 15A, after removing the pad oxide layer 144 by a wet etching, a gate oxide layer 148 and a first polysilicon layer 150 having a thickness of approximately 200Å and 4000Å, respectively are formed on the top surface of the substrate 142, and then, POCL₃ is doped so as to have the sheet resistance of the first polysilicon layer 150 under about 20Ω/□. Next, an oxide layer 180 for used in a program ion implantation and a second polysilicon layer 182 are formed to a thickness of approximately 3000Å and 4000Å, respectively. Again, POCL₃ is doped so that the sheet resistance of the second polysilicon layer 182 becomes approximately 20Ω/□. Thereafter, a second photoresist 184 is formed over the surface of the substrate 142, and the pattern of the second photoresist 184 is formed along the word line in the order of odd numbers or even numbers. And then, the exposed second polysilicon layer 182 and the oxide layer 180 are removed.

In FIG. 15B, after removing the second photoresist 184, a nitride layer 186 having a thickness of 2000-3000Å is deposited by a low pressure chemical vapor deposition method. As a result, the nitride layer 186 is formed on the top surface and on the side wall of the second polysilicon layer 182, on the side wall of the oxide layer 180 and on the top surface of the exposed first polysilicon layer 150. Following this, a third photoresist 188 is formed to a thickness of approximately 1μm and an etch back process is performed until the nitride layer 186 formed on the second polysilicon layer 182 is sufficiently exposed. Thus, the third photoresist 188 remains only on the region between the patterned second polysilicon layers 182.

As shown in FIG. 15C, the exposed nitride layer 186 is removed through a selective etching. Then the second polysilicon layer 182 formed under the removed nitride layer 186 is removed by a dry etching and the exposed first polysilicon layer 150 is removed. Consequently, the pattern of a plurality word lines 126, 128, 130, 132 and 134 disposed in a line is completed with spacing as much as the thickness of the nitride layer 186. And then, the processes from FIG. 13F to FIG. 13H are sequentially performed.

FIG. 16A to FIG. 16D are views illustrating manufacturing process of a NOR logic mask ROM and in particular, still another preferred embodiment from FIG. 13C to FIG. 13F.

Figure 16A:
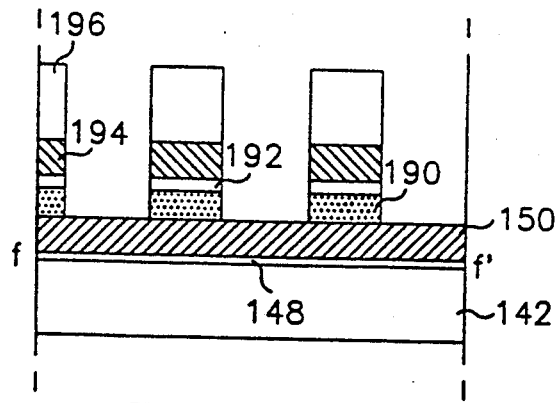
FIGS. 16A to 16D are views illustrating manufacturing process of a NOR logic mask ROM of still another preferred embodiment according to the present invention.

Referring to FIG. 16A, after removing the pad oxide layer 144 by a wet etching, a gate oxide layer 148 and a first polysilicon layer 150 having a thickness of approximately 200Å and 4000Å, respectively are formed on the top surface of the substrate 142 and then, POCL₃ is doped so as to have the sheet resistance of the first polysilicon layer 150 under about 20Ω/□. Next, a nitride layer 190 and an oxide layer 192 for used in a program ion implantation are formed to a thickness of approximately 3000Å and 1000Å, respectively and a second polysilicon layer 194 having a thickness of approximately 4000Å is formed. Again, the POCL₃ is doped so that the sheet resistance of the second polysilicon layer 194 becomes approximately 20Ω/□. Thereafter, a second photoresist 196 is formed over the surface of the substrate 142, and the pattern of the second photoresist 196 is formed along the word line in the order of odd numbers or even numbers. And then, the exposed second polysilicon layer 194 and the oxide layer 192 and nitride layer 190 for used in a program ion implantation are removed.

Figure 16B:
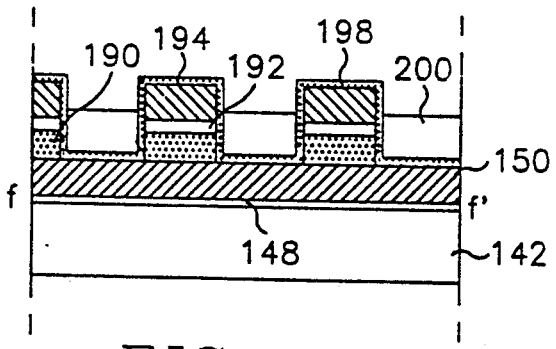

In FIG. 16B, after removing the second photoresist 196, a nitride layer 198 having a thickness of 200-500Å is formed by a low pressure chemical vapor deposition method. As a result, the nitride layer 198 is formed on the top surface and on the sidewall of the second polysilicon layer 194, on the sidewall of the oxide layer 192 and the nitride layer 198 for used in a program ion implantation and the top surface of the exposed first polysilicon layer 150. Following this, a third photoresist 200 is formed to a thickness of approximately 1μm and an etch back process is performed until the nitride layer 190 formed on the second polysilicon layer 194 is sufficiently exposed.

Figure 16C:
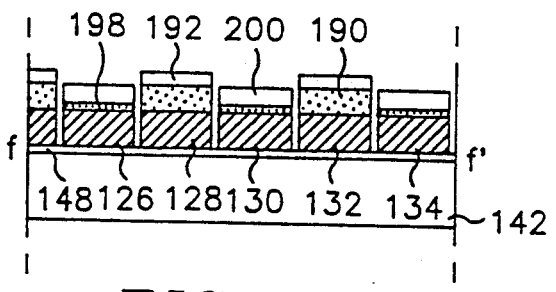

As shown in FIG. 16C, the exposed nitride layer 198 is removed through a selective etching. Then the second polysilicon layer 194 formed under the removed nitride layer 198 is removed by a dry etching and the exposed first polysilicon layer 150 is removed. Consequently, the pattern of a plurality word lines 126, 128, 130, 132 and 134 disposed in a line is completed with spacing as much as the thickness of the nitride layer 198.

Figure 16D:
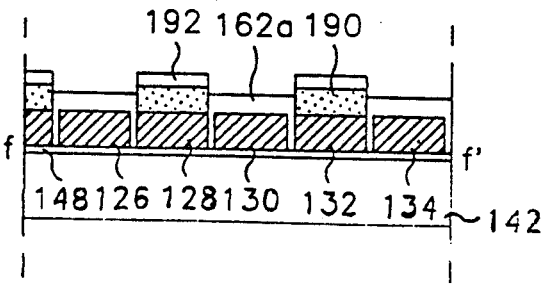

In FIG. 16D, after removing the third photoresist 200, the exposed nitride layer 198 is removed. In this case, there is no an influence caused by the etching process on the nitride layer 190 for used in a program ion implantation since the oxide layer 192 is formed thereon. Next, the process shown in FIG. 13F is performed. In FIG. 13F, the oxide layer for insulating between word lines is formed between the word lines by the oxide layer and the nitride layer formed on the word lines. However, as shown in FIG. 16D, the oxide layer 162a is formed on the surface of the exposed word line and on the sidewall of the word line. At this time, the thickness of the oxide layer formed on the exposed word line becomes 2000-3000Å. Moreover, on the surface of the word line 128 and 132, the growth of the oxide layer is suppressed by the nitride layer.

In the preferred embodiment, as a conductive layer for forming the word line, a polysilicon layer is used. However, tungsten silicide, titanium silicide, tantalum silicide or molybdenum silicide, etc., can be used. Moreover, the oxide layer for used in a program ion implantation and the nitride layer used in order to form different layers in etch rate on the surface of the word line may be performed in the reverse process order or replaced with each other. Further, in the preferred embodiment, after forming the insulation layer, a photoresist is formed and then an etch back process is performed for forming the word line spacing. However, Spin On Glass layer, Phospho Silicate Glass or Boro-Phospho Silicate Glass, etc., can be used instead of the photoresist. Furthermore, doping concentration and etchant of the first and second polysilicon layers can be adjusted so that the first polysilicon layer has slower etch rate than the second polysilicon layer.

Thus, in a method for manufacturing a NOR mask ROM, on the top surface of a first polysilicon layer for forming a word line, an insulation layer or a plurality of insulation layers and a second polysilicon layer are formed and patterned along the word line in the order of odd numbers or even numbers. Next, a nitride layer is formed over the surface of a substrate. Then, a photoresist is formed and an etch back process is performed. Thereafter, by using the photoresist as a mask, the exposed nitride layer and the first polysilicon or the insulation layer and the first polysilicon layer formed under the exposed nitride layer are sequentially etched. Therefore, the word line spacing can be adjusted with the thickness of the nitride layer. Moreover, on the top surface of the neighboring word lines, since different insulation layers are formed and the cell to be programmed is exposed by different etching process, the program ions can be implanted only on a wanted cell. That is, during the photolithography process, even if misalignment or overdevelopment is generated, since the neighboring cells are protected by the different insulation layers, there is no an influence caused by the etching process.

As described above, in a method for manufacturing NAND logic and NOR logic mask ROMs, since an insulation layer is formed after forming the pattern of a word line in the order of odd numbers or even numbers, a word line pattern having minute spacing under the limitation of a photolithography process can be formed by defining the word line spacing by the thickness of the insulation layer of the sidewall of the word line. Therefore, a highly integrated mask ROM can be easily achieved. Furthermore, since the word line is exposed through the different photolithography process after forming different insulation layers on the top surface of the neighboring word lines for programming a memory cell, even if an error is generated on the mask alignment, there is no an influence on the adjacent cell and predetermined impurities can be implanted only on a wanted cell. Thus, sufficient process margin can be ensured, and as a result, the yield of products is improved and the reliability of a process is increased. Therefore, a reliable large-scale mask ROM can be easily obtained.

While the present invention has been particularly shown and described with reference to the preferred embodiment thereof, it will be understood by those skilled in the art that foregoing and other changes in form and details may be made without departing from the spirit and scope of the present invention.

What is claimed is:

1. A mask read only memory device for programming a given cell by an ion implantation of impurities, comprising:
    a substrate of a first conductivity type;
    a plurality of word lies disposed on the substrate and separated from each other by a given spacing, said plurality of word lines extending in a first direction; and
    a plurality of bit lines disposed directly beneath the surface of the substrate and formed by diffusion of impurities having a second conductivity type, said plurality of bit lines extending in a second direction perpendicular to said first direction; and
    first and second insulation layers formed respectively on the surface of said plurality of word lies in the order of even numbers or odd numbers, respectively, said first insulation layer having a thickness corresponding to the given spacing between adjacent word lines.

2. The mask read only memory device as claimed in claim 1, wherein said first insulation layer is either etched by an etchant different from said second insulation layer, or has different etch rate from said second insulation layer.

3. The mask read only memory device as claimed in claim 2, wherein said first insulation layer is an oxide layer, and said second insulation layer is a nitride layer.

4. The mask read only memory device as claimed in claim 2, wherein said first insulation layer comprises an oxide layer and a nitride layer, and said second insulation layer is one of an oxide layer and a nitride layer.

5. The mask read only memory device as claimed in claim 4, wherein said second insulation layer has a thickness at least two times greater than a thickness of said first insulation layer in case where said first insulation layer and said second insulation layer are formed with a same layer.

6. The mask read only memory device as claimed in claim 2, wherein said first insulation layer is a nitride layer, and said second insulation layer is an oxide layer.

7. The mask read only memory device as claimed in claim 1, wherein said first insulation layer is one of an oxide layer and a nitride layer, and said second insulation layer comprises an oxide layer and a nitride layer.

8. A logic mask ROM, comprising:
   a semiconductor substrate having a plurality of diffusion regions of a given impurity adjacent to a contact region and a field oxide region and extending in a first direction said plurality of diffusion regions being separated and spaced-apart from each other by a first equidistance;
   a gate oxide layer disposed on the surface of said semiconductor substrate;
   a plurality of word lines positioned on the surface of said gate oxide layer extending in a second direction, said plurality of word lines being separated and spaced-apart by a second equidistance, each word line having a width substantially proportional to said first equidistance between adjacent diffusion regions, and each diffusion region having a width substantially proportional to said second equidistance between adjacent word lines;
   a first insulation layer disposed on selected word lines of said plurality of word lines, said first insulation layer having a thickness directly proportional to said second equidistance between adjacent word lines;
   a second insulation layer disposed to insulate said plurality of word lines; and
   a conduction layer positioned on the surface of said second insulation layer extending in said first direction perpendicular to said plurality of word lines and connected to the contact region of said semiconductor substrate.

9. The logic mask ROM as claimed in claim 8, wherein said first insulation layer is a nitride layer having a thickness approximately from 1000-2000Å.

10. The logic mask ROM as claimed in claim 8, wherein said first insulation layer is comprises of one of a nitride layer, a thermal silicon oxide layer, a spin-on-glass oxide layer, a low temperature oxide layer, a polysilicon layer and a combination thereof.

11. The logic mask ROM as claimed in claim 8, wherein said gate oxide layer is fabricated by the steps of:
   depositing a pad oxide layer of a thickness approximately of 300Å on the surface of the semiconductor substrate;
   depositing a nitride layer of a thickness approximately of 1500Å on the surface of said pad oxide layer;
   performing ions implantation of boron having a dosage of $6 \times 10^{13}$ ions/cm$^2$ at an energy level of 300 KeV into the surface of the semiconductor substrate to form channel stop regions;
   removing both the pad oxide layer and the nitride layer;
   forming a sacrificial oxide layer of a thickness approximately of 300Å;
   performing ions implantation of one of arsenic and phosphorous having a dosage of $6 \times 10^{12}$ ions/cm$^2$ at an energy level of 100 KeV into the surface of the semiconductor substrate to form channel stop regions;
   removing the sacrificial oxide layer; and
   forming said gate oxide layer of a thickness approximately of 250Å by dry oxidation at a temperature of 950° C. on the surface of said semiconductor substrate.

12. The logic mask ROM as claimed in claim 9, wherein said plurality of word lines being separated and spaced-apart by the second equidistance is fabricated by the steps of:
   depositing a first polysilicon layer having a sheet resistance less than 20Ω/☐ and a thickness approximately of 2000Å on the surface of said gate oxide layer, said first polysilicon layer representing of said plurality of word lines;
   depositing a first oxide layer of a thickness approximately of 1000-2000Å on the surface of said first polysilicon layer;
   depositing a second polysilicon layer having a sheet resistance less than 20Ω/☐ and a thickness approximately of 5000Å on the surface of said first oxide layer
   etching the second polysilicon layer and the first oxide layer in a mask pattern to selectively expose the first polysilicon layer;
   depositing the nitride layer representative of said first insulation layer of a thickness approximately of 1000-2000Å over the mask pattern covering the surface and sidewalls of the second polysilicon layer and the exposed first polysilicon layer; and
   consecutively etching the second polysilicon layer directly beneath the nitride layer deposited on the surface of the second polysilicon layer, and the first polysilicon layer directly beneath the nitride layer deposited on the sidewalls of the second polysilicon layer to form said plurality of word lines separated and spaced-apart by said second equidistance, wherein said second equidistance is directly proportional to the thickness of said nitride layer, and said nitride layer is alternatively formed on the surface of said plurality of word lines.

13. The logic mask ROM as claimed in claim 12, wherein said plurality of diffusion regions being separated and spaced-apart by the first equidistance is fabricated by performing ions implantation of one of arsenic and phosphorous having a dosage of $6 \times 10^{15}$ ions/cm$^2$ at an energy level of 40 KeV into the surface of the semiconductor substrate in between adjacent word lines.

14. The logic mask ROM as claimed in claim 12, further comprised the step of removing the first oxide layer on the alternate surface of said plurality of word lines for enabling selected word lines to program in an enhancement mode.

15. The logic mask ROM as claimed in claim 14, further comprised the step of performing ions implantation of boron having a dosage of $0.8 \times 10^{13} - 1.3 \times 10^{13}$ ions/cm$^2$ at an energy level of 65 KeV into the surface of the semiconductor substrate to form P-type channel stop regions.

16. The logic mask ROM as claimed in claim 8, wherein said second insulation layer is fabricated by flowing a low temperature oxide layer and a boro-phospho silicate glass layer in a nitrogen atmosphere at a temperature of 800°-925° C.

17. A logic mask ROM, comprising:
   a semiconductor substrate;

a gate oxide layer disposed on the surface of said semiconductor substrate;

a plurality of word lines positioned on the surface of said gate oxide layer extending in a first direction, said plurality of word lines being separated and spaced-apart by an equidistance;

a first insulation layer disposed on the surface of one of an odd number and an even number of word lines of said plurality of word lines, said first insulation layer having a thickness directly proportional to said equidistance between adjacent word lines;

a second insulation layer for insulating said plurality of word lines; and a conduction layer positioned on the surface of said second insulation layer extending in a second direction perpendicular to said plurality of word lines and connected to the contact region of said semiconductor substrate.

18. The logic mask ROM as claimed in claim 17, wherein said first insulation layer is a nitride layer having a thickness approximately 1000–3000Å.

19. The logic mask ROM as claimed in claim 18, wherein said gate oxide layer is fabricated by the steps of:

depositing a pad oxide layer of a thickness approximately of 300Å on the surface of the semiconductor substrate;

depositing a photo-resist layer on the surface of said pad oxide layer;

performing ions implantation of arsenic having a dosage of $6 \times 10^{16}$ ions/cm$^2$ at an energy level of 75 KeV into the surface of the semiconductor substrate to form source and drain regions;

removing the photo-resist layer;

performing ions implantation of boron having a dosage of $1 \times 10^{12}$ ions/cm$^2$ at an energy level of 30 KeV into the surface of the semiconductor substrate to adjust a threshold voltage;

removing the pad oxide layer; and forming said gate oxide layer of a thickness approximately of 200Å on the surface of the semiconductor substrate.

20. The logic mask ROM as claimed in claim 18, wherein said plurality of word lines being separated and spaced-apart by the equidistance is fabricated by the steps of:

depositing a first polysilicon layer having a sheet resistance approximately of 20Ω/□ and a thickness approximately of 4000Å on the surface of said gate oxide layer, said first polysilicon layer representing of said plurality of word lines;

depositing a first oxide layer of a thickness approximately of 7000Å on the surface of said first polysilicon layer;

etching the first oxide layer in a mask pattern to selectively expose the first polysilicon layer;

depositing the nitride layer representative of said first insulation layer of a thickness approximately of 1000–3000Å over the mask pattern covering the surface and sidewalls of the first oxide layer and the exposed first polysilicon layer; and consecutively dry etching the nitride layer deposited on the surface of the first oxide layer, and the first polysilicon layer directly beneath the nitride layer deposited on the sidewalls of the first oxide layer to form said plurality of word lines separated and spaced-apart by said second equidistance, wherein said second equidistance is directly proportional to the thickness of said nitride layer, and said nitride layer is alternatively formed on the surface of said plurality of word lines.

21. The logic mask ROM as claimed in claim 17, wherein said plurality of word lines being separated and spaced-apart by the equidistance is fabricated by the steps of:

depositing a first polysilicon layer having a sheet resistance approximately of 20Ω/□ and a thickness approximately of 200–400Å on the surface of said gate oxide layer, said first polysilicon layer representing of said plurality of word lines;

consecutively depositing a first nitride layer of a thickness approximately of 3000Å, a first nitride layer of a thickness approximately of 1000Å and a second polysilicon layer of a thickness approximately of 4000Å on the surface of said first polysilicon layer;

etching the second polysilicon layer, the first nitride layer and the first oxide layer in a mask pattern to selectively expose the first polysilicon layer;

depositing a second nitride layer representative of said first insulation layer of a thickness approximately of 200–500Å over the mask pattern covering the surface and sidewalls of the second polysilicon layer, the first nitride layer and the first oxide layer, and the exposed first polysilicon layer; and consecutively etching the second polysilicon layer deposited on the surface of the first oxide layer, and the first polysilicon layer directly beneath the second nitride layer deposited on the sidewalls of the second polysilicon layer, the first nitride layer and the first oxide layer to form said plurality of word lines separated and spaced-apart by said equidistance, wherein said equidistance is directly proportional to the thickness of said second nitride layer, and said second nitride layer is alternatively formed on the surface of said plurality of word lines.

22. A memory device, comprising:

a semiconductor substrate of a first conductivity type;

a plurality of bit lines disposed directly beneath the surface of said semiconductor substrate and formed by diffusion of impurities having a second conductivity type, said plurality of bit lines extending in a first direction;

a first insulation layer disposed on the surface of said semiconductor substrate;

a plurality of word lines positioned on the surface of said first insulation layer extending in a second direction perpendicular to said first direction, said plurality of word lines being separated ad spaced-apart by a give distance; and a second insulation layer disposed on the surface of selected word lines of said plurality of word lines, said second insulation layer having a thickness corresponding to said given distance between adjacent word lines.

23. The logic mask ROM as claimed in claim 22, wherein said second insulation layer is a nitride layer having a thickness approximate from 1000–3000Å.

* * * * *

UNITED STATES PATENT AND TRADEMARK OFFICE
CERTIFICATE OF CORRECTION

PATENT NO. : 5,317,534
DATED : 31 May 1994
INVENTOR(S) : Jeong-Hyeok Choi and Chul-Ho Shin It is certified that error appears in the above-indentified patent and that said Letters Patent is hereby corrected as shown below:

Column 14, claim 1, line 39, change "lies" to --lines--.

Column 15, claim 8, line 15, after "direction", insert --,--.

claim 10, line 45, change "comprises" to --comprised--.

Column 18, claim 22, line 56, change "give" to --given--.

Signed and Sealed this

Thirtieth Day of May, 1995

Attest:

BRUCE LEHMAN

Attesting Officer

Commissioner of Patents and Trademarks